(12) United States Patent
Keshavarzi et al.

(10) Patent No.: US 10,535,655 B2
(45) Date of Patent: Jan. 14, 2020

(54) INTEGRATED CIRCUITS AND MANUFACTURING METHODS THEREOF

(71) Applicant: Taiwan Semiconductor Manufacturing Company, Ltd., Hsin-Chu (TW)

(72) Inventors: Ali Keshavarzi, Los Altos Hills, CA (US); Ta-Pen Guo, Taipei (TW); Shu-Hui Sung, Baoshan Township (TW); Hsiang-Jen Tseng, Hsinchu (TW); Shyue-Shyh Lin, Hsinchu County (TW); Lee-Chung Lu, Taipei (TW); Chung-Cheng Wu, Hsinchu County (TW); Li-Chun Tien, Tainan (TW); Jung-Chan Yang, Taoyuan County (TW); Ting-Yu Chen, Hsinchu (TW); Min Cao, Hsinchu (TW); Yung-Chin Hou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 52 days.

(21) Appl. No.: 15/094,697

(22) Filed: Apr. 8, 2016

(65) Prior Publication Data
US 2016/0372469 A1 Dec. 22, 2016

Related U.S. Application Data

(63) Continuation of application No. 13/086,186, filed on Apr. 13, 2011, now Pat. No. 9,312,260, which is a
(Continued)

(51) Int. Cl.
*H01L 27/092* (2006.01)
*H01L 21/8238* (2006.01)
(Continued)

(52) U.S. Cl.
CPC .... *H01L 27/092* (2013.01); *H01L 21/823871* (2013.01); *H01L 23/485* (2013.01);
(Continued)

(58) Field of Classification Search
CPC ........... H01L 27/092; H01L 21/823871; H01L 23/485; H01L 29/0649; H01L 29/4238; H01L 29/495; H01L 29/66545
(Continued)

(56) References Cited

U.S. PATENT DOCUMENTS 4,821,085 A * 4/1989 Haken ............... H01L 21/31111
257/384
4,866,009 A 9/1989 Matsuda
(Continued)

FOREIGN PATENT DOCUMENTS

| CN | 101615614 | 12/2009 |
|---|---|---|
| CN | 102682154 | 9/2012 |

(Continued)

OTHER PUBLICATIONS

Notice of Allowance of Patent dated May 14, 2013 from corresponding application No. KR 10-2011-0078272.

*Primary Examiner* — Ori Nadav
(74) *Attorney, Agent, or Firm* — Haynes and Boone, LLP

(57) ABSTRACT

An integrated circuit includes a first diffusion area for a first type transistor. The first type transistor includes a first drain region and a first source region. A second diffusion area for a second type transistor is separated from the first diffusion area. The second type transistor includes a second drain region and a second source region. A gate electrode continuously extends across the first diffusion area and the second diffusion area in a routing direction. A first metallic structure is electrically coupled with the first source region. A second metallic structure is electrically coupled with the
(Continued)

second drain region. A third metallic structure is disposed over and electrically coupled with the first and second metallic structures. A width of the first metallic structure is substantially equal to or larger than a width of the third metallic structure.

14 Claims, 13 Drawing Sheets

Related U.S. Application Data continuation-in-part of application No. 12/787,966, filed on May 26, 2010, now Pat. No. 8,362,573.

(51) Int. Cl.
    *H01L 23/485* (2006.01)
    *H01L 27/02* (2006.01)
    *H01L 29/423* (2006.01)
    *H01L 29/66* (2006.01)
    *H01L 29/78* (2006.01)
    *H01L 29/06* (2006.01)
    *H01L 29/49* (2006.01)

(52) U.S. Cl.
    CPC ...... *H01L 27/0207* (2013.01); *H01L 29/0649* (2013.01); *H01L 29/4238* (2013.01); *H01L 29/495* (2013.01); *H01L 29/66545* (2013.01); *H01L 29/7833* (2013.01); *H01L 2924/0002* (2013.01)

(58) Field of Classification Search
    USPC ........................................................ 257/369
    See application file for complete search history.

(56) References Cited

U.S. PATENT DOCUMENTS

| | | |
|---|---|---|
| 5,097,297 A | 3/1992 | Nakazawa |
| 5,204,286 A | 4/1993 | Doan |
| 5,330,934 A | 7/1994 | Shibata et al. |
| 5,616,940 A | 4/1997 | Kato et al. |
| 5,637,899 A | 6/1997 | Eimori et al. |
| 5,723,883 A | 3/1998 | Gheewalla |
| 5,808,365 A | 9/1998 | Mori |
| 5,889,335 A | 3/1999 | Kuroi et al. |
| 5,923,059 A | 7/1999 | Gheewala |
| 6,411,543 B2 | 6/2002 | Narui et al. |
| 6,444,520 B1 | 9/2002 | Dennison et al. |
| 6,922,823 B2 | 7/2005 | Tester |
| 7,112,855 B2 | 9/2006 | Fong |
| 7,183,612 B2 | 2/2007 | Okushima |
| 7,250,657 B2 | 7/2007 | Liaw |
| 7,266,787 B2 | 9/2007 | Hughes et al. |
| 7,343,570 B2 | 3/2008 | Bowers et al. |
| 7,595,245 B2 | 9/2009 | Wang |
| 7,763,534 B2 | 7/2010 | Smayling et al. |
| 7,908,571 B2 | 3/2011 | Bowers et al. |
| 7,968,447 B2 | 6/2011 | Lee et al. |
| 8,225,255 B2 | 7/2012 | Ouyang et al. |
| 2002/0009883 A1* | 1/2002 | Ogure .................. C23C 14/046 438/676 |
| 2006/0105584 A1* | 5/2006 | Roters ............... H01L 21/28247 438/795 |
| 2006/0148251 A1* | 7/2006 | Broekaart ......... H01L 21/32136 438/669 |
| 2009/0289499 A1* | 11/2009 | Sato ........................ H02J 1/00 307/18 |
| 2010/0127333 A1 | 5/2010 | Hou et al. |
| 2011/0291197 A1 | 12/2011 | Wu et al. |
| 2012/0161217 A1 | 6/2012 | Sato |

FOREIGN PATENT DOCUMENTS

| | | |
|---|---|---|
| JP | 2002026298 | 1/2002 |
| KR | 10-2009-0126588 | 12/2009 |
| KR | 10-2010-0057507 | 5/2010 |

\* cited by examiner

INTEGRATED CIRCUITS AND MANUFACTURING METHODS THEREOF

CROSS-REFERENCES TO RELATED APPLICATIONS

The present application is a Continuation of U.S. patent application Ser. No. 13/086,186, entitled "INTEGRATED CIRCUITS AND MANUFACTURING METHODS THEREROF," filed Apr. 13, 2011, which is a Continuation-in-part of U.S. patent application Ser. No. 12/787,966, entitled "INTEGRATED CIRCUITS AND MANUFACTURING METHODS THEREOF," filed May 26, 2010, now U.S. Pat. No. 8,362,573, which is related to U.S. patent application Ser. No. 13/722,142 which is Divisional of Ser. No. 12/787,966, filed May 26, 2010, now U.S. Pat. No. 8,362,573, each of which are hereby incorporated by reference in their entirety.

TECHNICAL FIELD

The present disclosure relates generally to the field of semiconductor devices, and more particularly, to integrated circuits and method of forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1A:
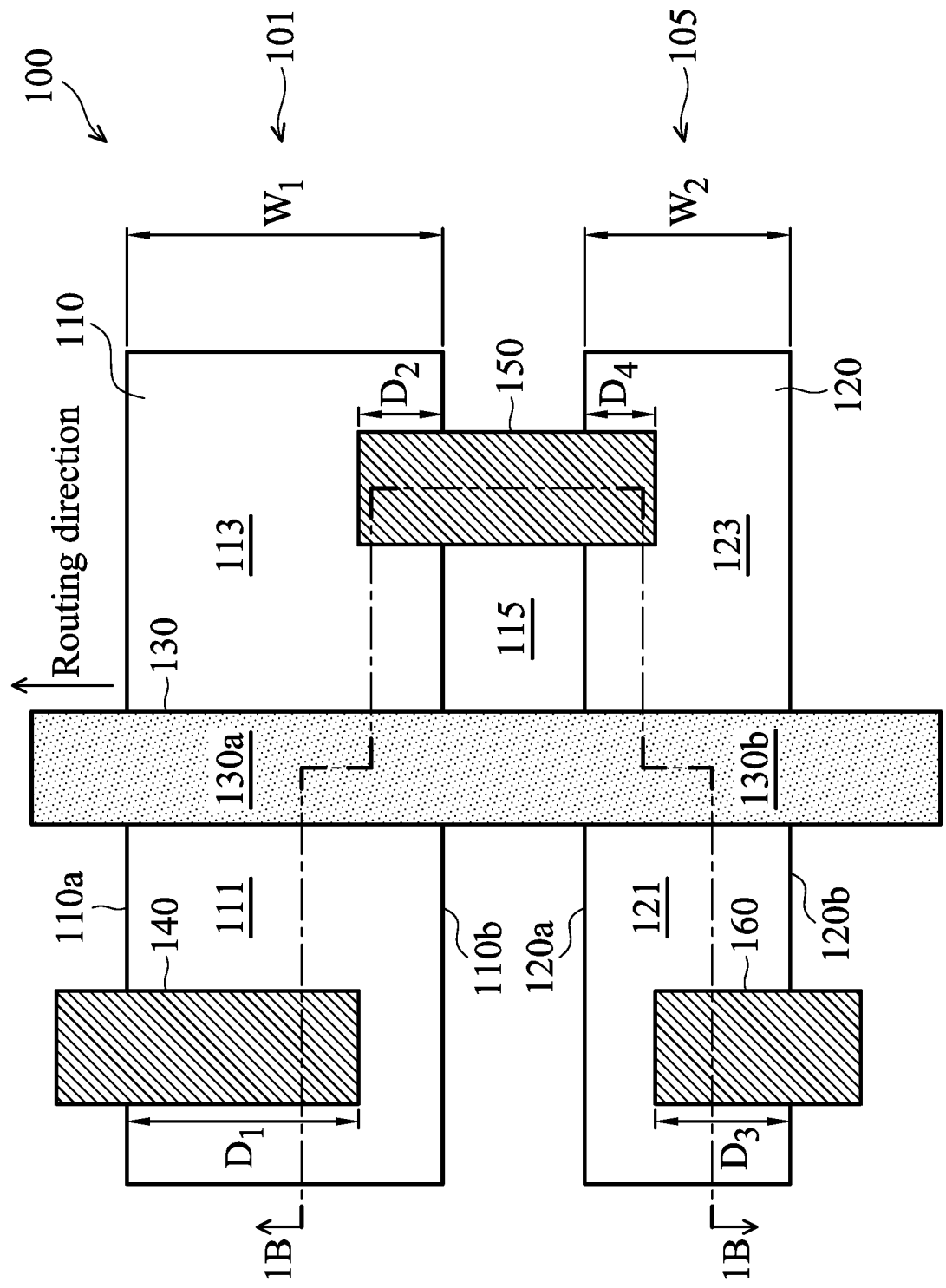
FIG. 1A is a schematic drawing illustrating exemplary layout layers of an exemplary integrated circuit.

For CMOS devices, contact plugs are generally used for electrical connections between source/drain (S/D) regions and metal layers M1 of transistors. Generally, the contact plugs are disposed in contact holes that are formed in an inter-level dielectric (ILD) layer. The contact holes marked on a mask layer are square. The square patterns on the mask layer are transferred on the ILD layer and become rounded. The contact plugs thus have a substantially round shape from a top view that is orthogonal to a surface of a wafer on which the transistors are formed. It is found that if the geometry of the CMOS devices scales down, the S/D resistances of the transistors increase. The increased S/D resistances compromise electrical performances, e.g., operation current, speed, frequency, etc, of the transistors or circuits.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic drawing illustrating exemplary layout layers of an exemplary integrated circuit. The exemplary drawing shown in FIG. 1A merely depicts overlaps of a diffusion layer, a gate electrode layer, and a metallic structure. In FIG. 1A, an integrated circuit 100 can include a P-type transistor 101 that is electrically coupled with an N-type transistor 105. In some embodiments, the integrated circuit 100 can be a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, E²PROME, a field-programmable gate circuit, or any combinations thereof. In some embodiments, the P-type transistor 101 and the N-type transistor 105 can be deployed in an inverter, a logic gate circuit, an amplifier, a charge pump circuit, or any circuit that have a CMOS device.

Referring to FIG. 1A, the integrated circuit 100 can include diffusion areas 110 and 120. The diffusion area 110 can include a source region 111 and a drain region 113 of the P-type transistor 101. The diffusion area 120 can include a source region 121 and a drain region 123 of the N-type transistor 105. The diffusion area 110 can be spaced from the diffusion area 120 by an isolation structure 115. The isolation structure 115 can include a shallow trench isolation (STI) structure and/or a local oxidation of silicon (LOCOS) structure. In some embodiments, widths $W_1$ and $W_2$ of the diffusion areas 110 and 120, respectively, are different. In other embodiments, the width $W_1$ of the diffusion area 110 is larger than the width $W_2$ of the diffusion area 120.

Referring to FIG. 1A, a gate electrode 130 can continuously extend across the diffusion areas 110 and 120 in a routing direction of the gate electrode 130. In some embodiments, the gate electrode 130 can include gate electrode portions 130a and 130b for the P-type transistor 101 and the N-type transistor 105, respectively. The gate electrode portions 130a and 130b can be configured to receive voltages, controlling on or off of the P-type transistor 101 and the N-type transistor 105, respectively. It is noted that the routing direction shown in FIG. 1A is merely exemplary. In other embodiments, the routing direction can be in the horizontal direction or any direction that tilts with respect to the horizontal direction.

Referring again to FIG. 1A, a metallic structure 140 can be electrically coupled with the source region 111 of the P-type transistor 101. The metallic structure 140 and the diffusion area 110 can overlap with a distance $D_1$ in the routing direction. A metallic structure 150 can be electrically coupled with the drain regions 113 and 123 of the P-type transistor 101 and the N-type transistor 105, respectively. The metallic structure 150 and the diffusion area 110 can overlap with a distance $D_2$ in the routing direction. The distance $D_1$ is larger than the distance $D_2$. In some embodiments, the metallic structure 140 directly contacts the source region 111. The metallic structure 150 directly contacts the drain regions 113 and 123.

Referring to FIG. 1A, a metallic structure 160 can be electrically coupled with the source region 121 of the N-type transistor 101. The metallic structure 160 and the diffusion area 120 can overlap with a distance $D_3$ in the routing direction. The metallic structure 150 and the diffusion area 120 can overlap with a distance $D_4$ in the routing direction. In some embodiments, the distance $D_3$ is larger than the distance $D_4$. In other embodiments, the distance $D_3$ is larger than the distance $D_2$. In some embodiments, the metallic structure 160 directly contacts the source region 121.

It is noted that the structure shown in FIG. 1A is merely exemplary. In some embodiments, a sum of distances $D_1$ and $D_2$ can be substantially equal to the width $W_1$. In other embodiments, a sum of distances $D_1$ and $D_2$ can be larger or smaller than the width $W_1$. In still other embodiments, a sum of distances $D_3$ and $D_4$ can be substantially equal to the width $W_2$. In yet still other embodiments, a sum of distances $D_3$ and $D_4$ can be larger or smaller than the width $W_2$.

It is also noted that the term "a metallic structure" here can mean a metallic line, a metallic wire, a metallic rope, a metallic string, a metallic code, a metallic slat, or any metallic structure that continuously extends for a predetermined distance. In some embodiments, the metallic structures 140, 150, and 160 can be referred to as a metal zero (M0) layer.

In some embodiments, a ratio of the distance $D_1$ to the width $W_1$ is between about 0.75:1 and 1:1, and a ratio of the distance $D_2$ to the width $W_1$ is between about 0.1:1 and 0.33:1. In other embodiments, a ratio of the distance $D_3$ to the width $W_2$ is between about 0.75:1 and 1:1, and a ratio of the distance $D_4$ to the width $W_2$ is between about 0.1:1 and 0.33:1.

It is noted that the metallic structures 140, 150, and 160 can each at least partially continuously extend over the diffusion areas 110 and/or 120 for electrically coupling the respective source and drain regions. With the at least partially continuously extending structures, the source/drain (S/D) resistances of the transistors can be reduced.

It is also noted that the distances $D_2$ and $D_4$ each do not continuously extend from an edge 110a to an opposite edge 110b of the diffusion area 110 and an edge 120a to an opposite edge 120b of the diffusion area 120, respectively. The metallic structure 150 does not fully cover the diffusion areas 110 and 120 in the routing direction. With the structures, parasitic capacitances between the gate electrode portion 130 to each of the metallic structures 140, 150, and 160, and/or parasitic capacitances among the metallic structures 140, 150, and 160 can be reduced. By modifying the resistances and/or the parasitic capacitances, the electrical characteristics, e.g., operation speed, operation frequency, etc, of the integrated circuit 100 can be desirably achieved.

Table 1 illustrates speed simulations for at least one inverter with various fingers. As shown in Table 1, the structures with $D_1/W_1$, $D_2/W_1$, $D_3/W_2$, and $D_4/W_2$ being 1/1 are used as bases. The base structures each have metallic structures 140, 150, and 160 fully covering the diffusion areas 110 or 120 in the routing direction. The simulation speed of the base structures are presumed as 1.

TABLE 1

| | Ratios of $D_1/W_1$ and $D_3/W_2$ are 1/1 and ratios of $D_2/W_1$ and $D_4/W_2$ are 1/1 | Ratios of $D_1/W_1$ and $D_3/W_2$ are 1/1 and ratios of $D_2/W_1$ and $D_4/W_2$ are 0.33/1 | Ratios of $D_1/W_1$ and $D_3/W_2$ are 0.75/1 and ratios of $D_2/W_1$ and $D_4/W_2$ are 0.33/1 |
| --- | --- | --- | --- |
| 1 finger | 1 | 1.096 | 1.104 |
| 4 fingers | 1 | 1.088 | 1.089 |
| 24 fingers | 1 | 1.084 | 1.081 |

Compared with the base structures, exemplary structures with $D_1/W_1$, $D_3/W_2$ being 1/1 and $D_2/W_1$, $D_4/W_2$ being 0.33/1 can provide a speed gain by 9.6%, 8.8%, and 8.4% for 1-finger, 4-fingers, and 24-fingers structures, respectively, as shown in the middle column. Another exemplary structures with $D_1/W_1$, $D_3/W_2$ being 0.75/1 and $D_2/W_1$, $D_4/W_2$ being 0.33/1 can provide a speed gain by 10.4%, 8.9%, and 8.1% for 1-finger, 4-fingers, and 24-fingers structures, respectively, as shown in the right column. It is found that the modification and/or changes of $D_1/W_1$, $D_2/W_1$, $D_3/W_2$, and/or $D_4/W_2$ can achieve unexpected speed gains of inverters.

Figure 1B:
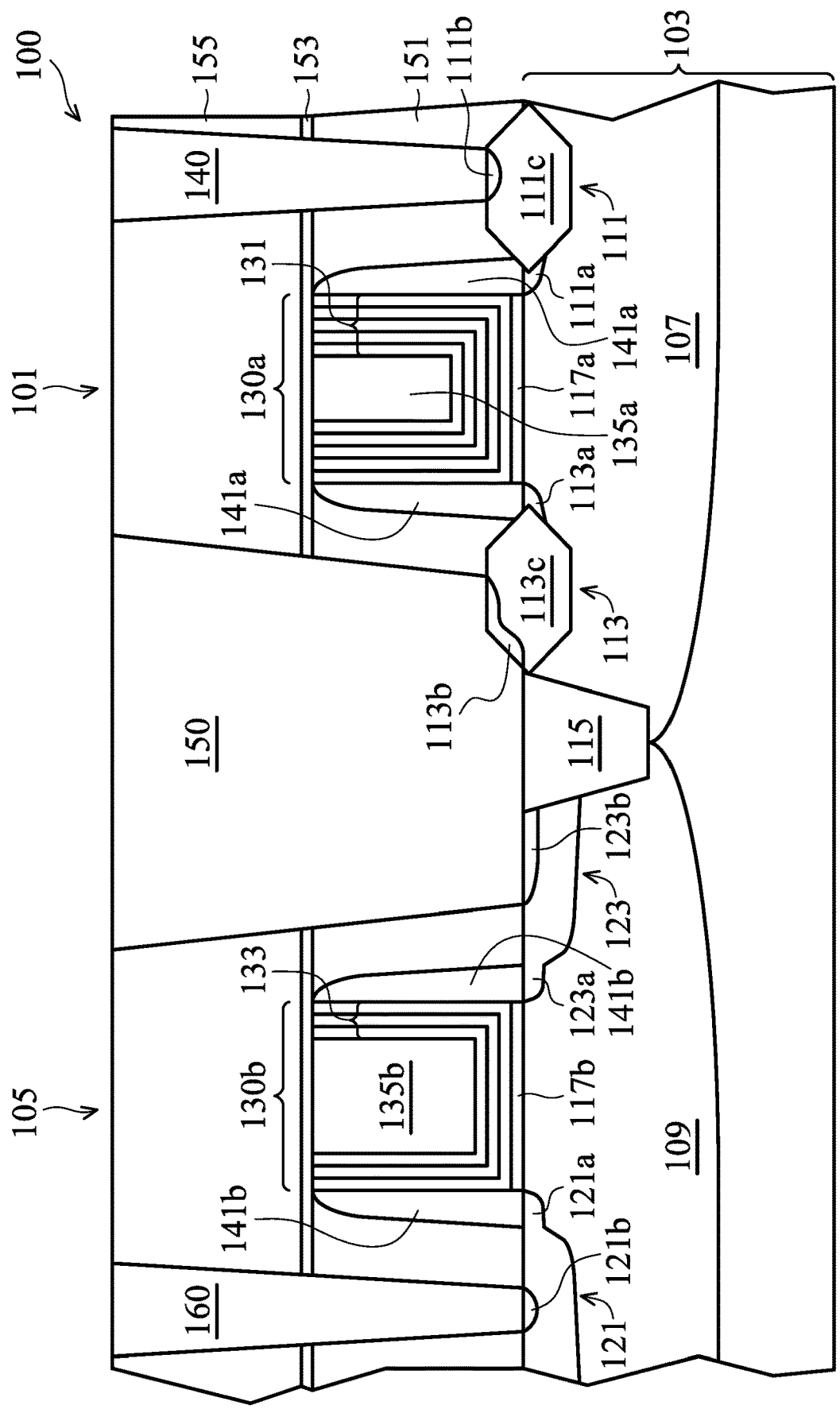
FIG. 1B is a cross-sectional view of an exemplary integrated circuit taken along a section line 1B-1B shown in FIG. 1A.

FIG. 1B is a cross-sectional view of an exemplary integrated circuit taken along a section line 1B-1B shown in FIG. 1A. As noted, FIG. 1A merely illustrates several layout layers of the integrated circuit 100. The cross-sectional view shown in FIG. 1B can depict more features of the integrated circuit 100.

Referring to FIG. 1B, the P-type transistor 101 and the N-type transistor 105 can be formed on a substrate 103. As noted, the P-type transistor 101 and the N-type transistor 105 can be separated by the isolation structure 115. In some embodiments, the substrate 103 may include an elementary semiconductor material, a compound semiconductor material, an alloy semiconductor material, or any other suitable material or combinations thereof. The elementary semiconductor material can include silicon or germanium in crystal, polycrystalline, or an amorphous structure. The compound semiconductor material can include silicon carbide, gallium arsenide, gallium phosphide, indium phosphide, indium arsenide, and indium antimonide. The alloy semiconductor material can include SiGe, GaAsP, AlInAs, AlGaAs, GaInAs, GaInP, and GaInAsP. In one embodiment, the alloy semiconductor substrate may have a gradient SiGe feature in which the Si and Ge composition change from one ratio at one location to another ratio at another location. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

In some embodiments, an N-type well region 107 and/or a P-type well region 109 can be optionally formed in the substrate 103 for the P-type transistor 101 and the N-type transistor 105, respectively. The N-type well region 107 can have dopants such as Arsenic (As), Phosphorus (P), other group V elements, or any combinations thereof. The P-type well region 109 can have dopants such as Boron (B) and/or other group III elements.

Figure 2A:
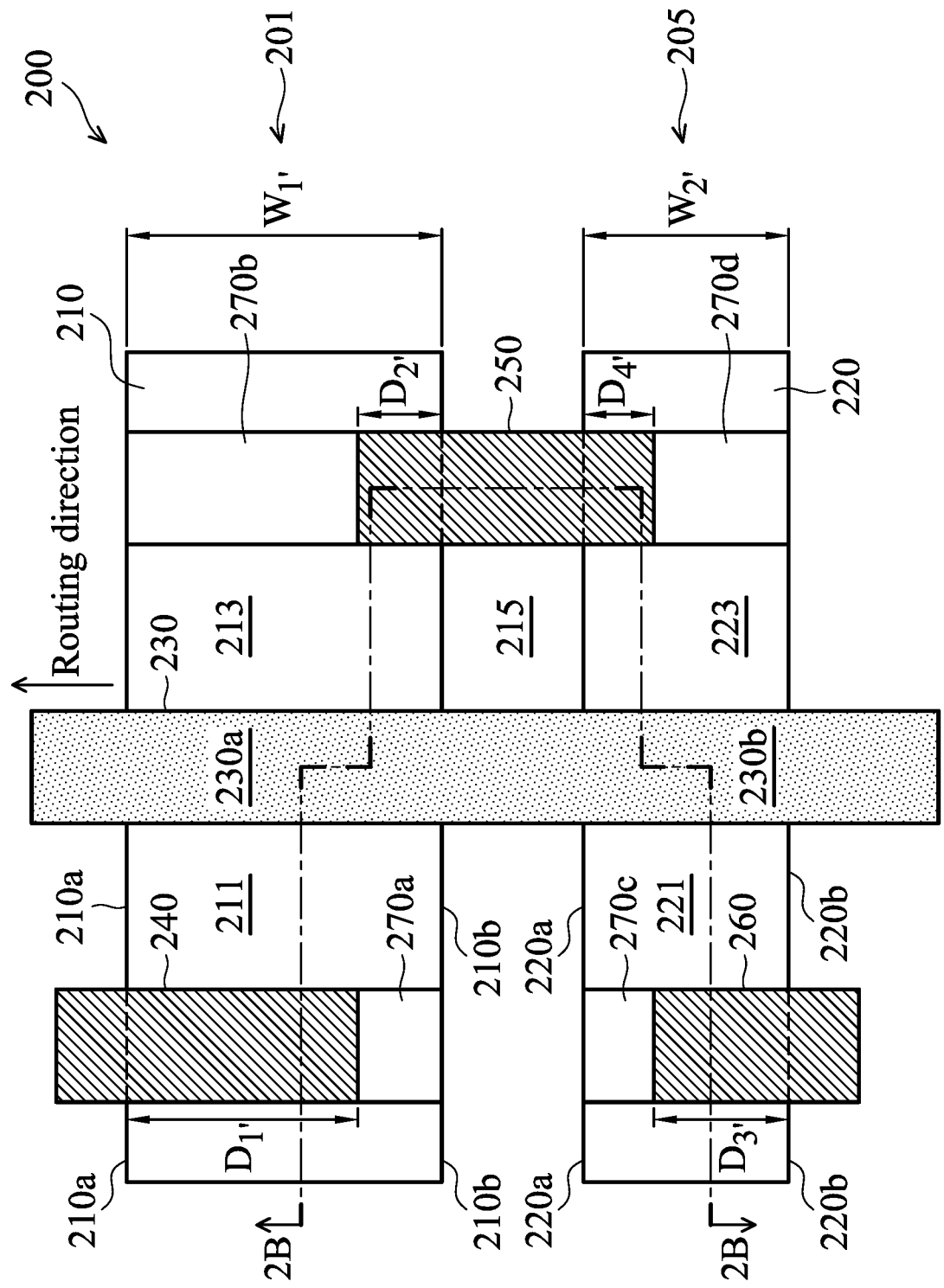
FIG. 2A is a schematic drawing illustrating exemplary layout layers of another exemplary integrated circuit.
Figure 2B:
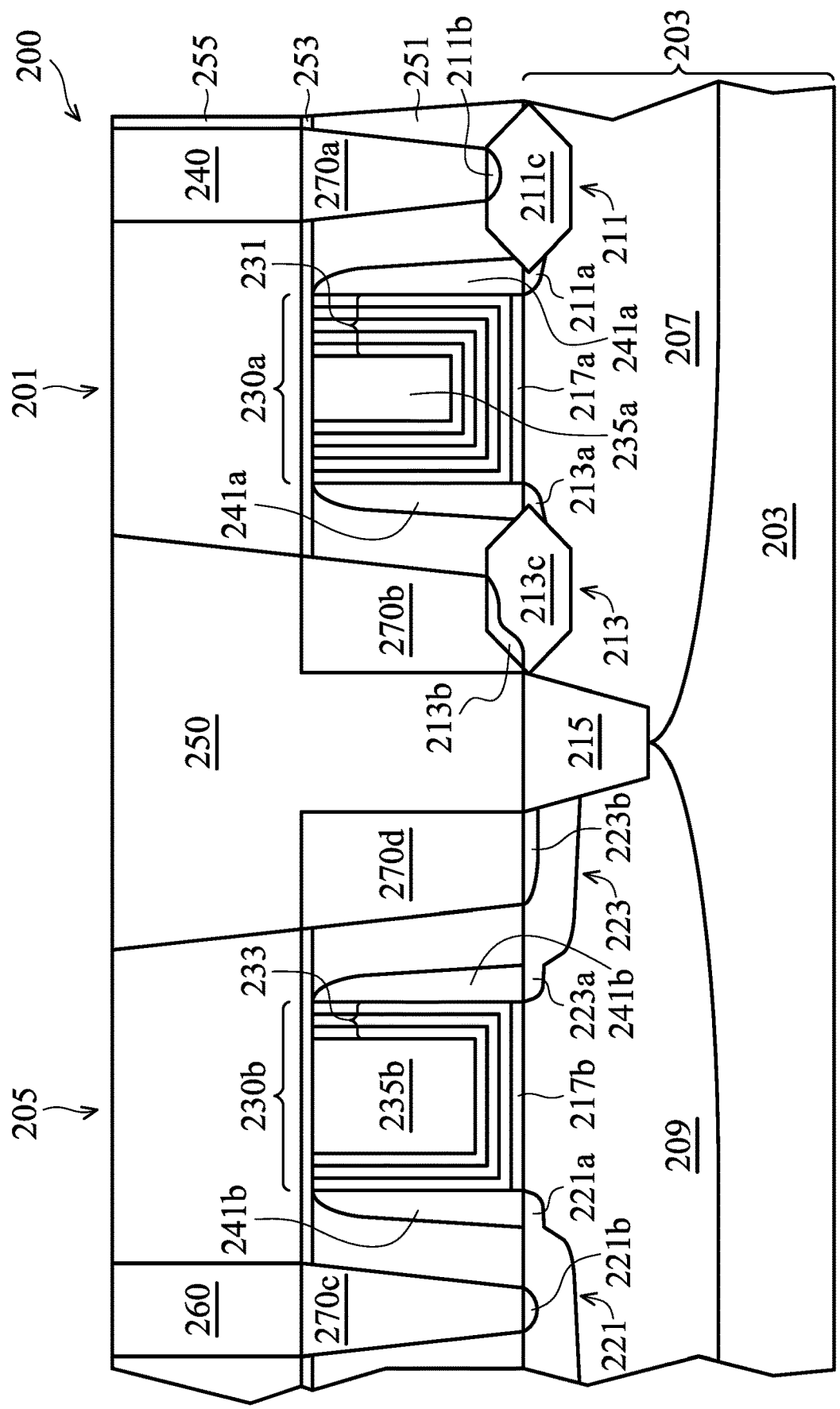
FIG. 2B is a cross-sectional view of an exemplary integrated circuit taken along a section line 2B-2B shown in FIG. 2A.

Referring to FIG. 2B, the P-type transistor 101 can include the source region 111 and the drain region 113. In some embodiments, the source region 111 and the drain region 113 can include structures 111c or 113c, respectively, that can provide a stress to a channel (not labeled) of the P-type transistor 101. The stressed channel can modify a mobility of carriers therein so as to change electrical characteristics, e.g., electrical current, of the P-type transistor 101. In some embodiments, the structures 111c and 113c in the source region 111 and the drain region 113 can be referred to as a raised source and a raised drain, respectively. In other embodiments, the structures 111c and 113c each can include a single SiGe or $Si_xGe_{1-x}$ layer, a multi-layer SiGe or $Si_xGe_{1-x}$ structure, an epitaxial structure, a compound material structure, other materials that can modify the carrier mobility of the P-type transistor 101, or any combinations thereof.

In some embodiments, the source region 111 and the drain region 113 can optionally include P-type lightly-doped drains (LDDs) 111a and 113a, respectively. The P-type LDDs 111a and 113a can each have a dopant type that is opposite to that of the N-type well region 107. In other embodiments, the source region 111 and the drain region 113 can include silicide regions 111b and 113b, respectively. The silicide regions 111b and 113b may comprise at least one material such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, or any combinations thereof.

Referring again to FIG. 2B, the gate electrode portion 130a can include an interfacial dielectric layer 117a. The interfacial dielectric layer 117a can be disposed over the substrate 103. The interfacial dielectric layer 117a may include a material such as silicon oxide, silicon nitride, silicon oxynitride, other gate dielectric materials, or any combinations thereof.

In some embodiments, the gate electrode portion 130a can include a multi-layer structure 131 that can include at least one high dielectric constant (high-k) layer and at least one metal work function layer. The at least one high-k dielectric layer can be formed over the interfacial layer 117a. The high-k dielectric layer can include high-k dielectric materials such as $HfO_2$, HfSiO, HfSiON, HfTaO, HfTiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the at least one metal work function layer of the multi-layer structure 131 can include at least one P-metal work function layer and at least one N-metal work function layer. In other embodiments, the at least one metal work function layer of the gate electrode portion 130a can solely include at least one P-metal work function layer without any N-metal work function layer. In some embodiments, P-type work function materials can include compositions such as ruthenium, palladium, platinum, cobalt, nickel, and conductive metal oxides, and/or other suitable materials. N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, the multi-layer structure 131 can include at least one diffusion barrier. The at least one diffusion barrier can be disposed between the gate dielectric material and the work function metal material. The diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

Referring to FIG. 1B, the gate electrode portion 130a can include a conductive layer 135a. The conductive layer 135a can be surrounded by the multi-layer structure 131. The conductive layer 135a can be made of at least one material, such as aluminum, copper, Ti, TiN, TaN, Ta, TaC, TaSiN, W, WN, MoN, MoON, $RuO_2$, and/or other suitable materials.

Referring again to FIG. 1B, the N-type transistor 105 can include the source region 121 and the drain region 123. In some embodiments, the source region 121 and the drain region 123 can optionally include N-type lightly-doped drains (LDDs) 121a and 123a, respectively. The N-type LDDs 121a and 123a can have a dopant type that is opposite to that of the P-type well region 109. In other embodiments, the source region 121 and the drain region 123 can include silicide regions 121*b* and 123*b*, respectively. The silicide regions 121*b* and 123*b* can have a metallic material that is same as or similar to that of the silicide regions 111*b* and 113*b*.

In other embodiments, the source region 121 and the drain region 123 can each include a stress structure (not shown). The stress structures can modify the carrier mobility in the channel of the N-type transistor 105. In some embodiments, the stress structures can each include a single SiC or $Si_xC_{1-x}$ layer, a multi-layer SiC or $Si_xC_{1-x}$ structure, an epitaxial structure, a compound material structure, other materials that can modify the carrier mobility of the N-type transistor 105, or any combinations thereof.

Referring again to FIG. 2B, the gate electrode portion 130*b* can include an interfacial dielectric layer 117*b*. The interfacial dielectric layer 117*b* can be disposed over the substrate 103. The interfacial dielectric layer 117*b* may include a material such as silicon oxide, silicon nitride, silicon oxynitride, other gate dielectric materials, and/or combinations thereof.

In some embodiments, the gate electrode portion 130*b* can include a multi-layer structure 133 that can include at least one high dielectric constant (high-k) layer and at least one metal work function layer. The at least one high-k dielectric layer can be formed over the interfacial layer 117*b*. In some embodiments, the at least one high-k dielectric layer of the multi-layer structure 133 can be as same as or similar to that of the multi-layer structure 131.

In some embodiments, the at least one metal work function layer of the gate electrode portion 130*b* can solely include at least one N-type metal work function layer without any P-type metal work function layer. In some embodiments, N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, the multi-layer structure 133 can include at least one diffusion barrier. The at least one diffusion barrier can be disposed between the gate dielectric material and the work function metal material. The diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

Referring to FIG. 1B, the gate electrode portion 130*b* can include a conductive layer 135*b*. The conductive layer 135*b* can be surrounded by the multi-layer structure 133. The conductive layer 135*b* can be made of at least one material that is the same as or similar to that of the conductive layer 135*a*.

Referring to FIG. 1B, spacers 141*a* and 141*b* can be optionally disposed on sidewalls of the gate electrode portions 130*a* and 130*b*, respectively. The spacers 141*a* and 141*b* can be made of at least one material, such as silicon oxide, silicon nitride, silicon oxynitride, other dielectric materials, or any combinations thereof.

Referring to FIG. 1B, at least one dielectric layer 151 can be disposed over the substrate 103 and around the spacers 141*a* and 141*b*. The at least one dielectric layer 151 can include at least one material such as phosphorous-doped silicate glass (PSG), boron-doped silicate glass (BSG), boron-phosphorous-doped silicate glass (BPSG), undoped silicate glass (USG), silicon oxide, silicon oxide, silicon nitride, silicon oxynitride, low-k dielectric material, other dielectric materials, or combinations thereof.

In some embodiments, at least one etch stop layer (ESL) 153 can be disposed over the at least one dielectric layer 151. The at least one ESL 153 can include at least one material such as silicon nitride, silicon oxynitride, silicon carbide, silicon oxycarbide, other dielectric materials, or any combinations thereof.

Referring to FIG. 1B, at least one dielectric layer 153 can be disposed over the at least one ESL 153. The at least one dielectric layer 153 can include at least one material such as silicon oxide, e.g., plasma-enhanced oxide (PEOX), undoped silicate glass (USG), phosphorous-doped silicate glass (PSG), boron-doped silicate glass (BSG), boron-phosphorous-doped silicate glass (BPSG), silicon oxide, silicon oxide, silicon nitride, silicon oxynitride, low-k dielectric material, other dielectric materials, or combinations thereof.

In FIG. 1B, the metallic structures 140, 150, and 160 can be disposed through the dielectric layers 151, 155, and the ESL 153. In some embodiments, the metallic structures 140, 150, and 160 can each include at least one barrier layer (not shown) at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In other embodiments, the metallic structures 140, 150, and 160 can each be made of at least one material, such as aluminum, copper, Ti, TiN, TaN, Ta, TaC, TaSiN, W, WN, MoN, MoON, $RuO_2$, and/or other suitable materials.

In some embodiments, the metallic structures 140 and 160 can directly contact the source regions 111 and 121, respectively. The metallic structure 150 can directly contact the drain regions 113 and 123. In other embodiments, the metallic structures 140 and 160 can directly contact the silicide regions 111*b* and 121*b*, respectively. The metallic structure 150 can directly contact the silicide regions 113*b* and 123*b*.

In some embodiments, other dielectric materials, via plugs, metallic regions, and/or metallic lines (not shown) can be formed over the gate electrode portions 130*a* and 130*b* for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

FIG. 2A is a schematic drawing illustrating exemplary layout layers of another exemplary integrated circuit. Items of FIG. 2A that are the same items in FIG. 1A are indicated by the same reference numerals, increased by 100. In FIG. 2A, an integrated circuit 200 can include a plurality of metallic structure, e.g., metallic structures 270*a*-270*d*, each directly contacting one of source regions 211, 221 and drain regions 213, 223. In some embodiments, the metallic structures 270*a*-270*d* can at least partially overlap respective metallic structures 240, 250, and 260 in the routing direction.

In some embodiments, the width of each of the metallic structures 270*a*-270*d* can be substantially equal the respective metallic structures 240, 250, and 260. In other embodiments, the metallic structures 270a-270d can be wider or narrower than the respective metallic structures 240, 250, and 260. In some embodiments, the metallic structures 270a-270d can be referred to as an M01 metal structure and the metallic structures 240, 250, and 260 can be referred to as M02 metal structures.

In some embodiments, the metallic structures 270a-270d can each continuously extend from an edge 210a to an opposite edge 210b of the diffusion area 210 or an edge 220a to an opposite edge 220b of the diffusion area 220. In other embodiments, the metallic structures 270a-270b can each extend over or shorten from the edges 210a-210b by a distance that is about 5% of a width $W_{1'}$ of the diffusion area 210 or less. In still other embodiments, the metallic structures 270c-270d can each extend over or shorten from the edges 220a-220b by a distance that is about 5% of a width $W_{2'}$ of the diffusion area 220 or less.

In some embodiments, the metallic structure 240 and the diffusion area 210 can overlap with a distance $D_{1'}$ in the routing direction. The metallic structure 250 and the diffusion area 210 can overlap with a distance $D_{2'}$ in the routing direction. The distance $D_{1'}$ is larger than the distance $D_{2'}$. The metallic structure 260 and the diffusion area 220 can overlap with a distance $D_{3'}$ in the routing direction. The metallic structure 250 and the diffusion area 220 can overlap with a distance $D_{4'}$ in the routing direction. In some embodiments, the distance $D_{3'}$ is larger than the distance $D_{4'}$. In other embodiments, the distance $D_{3'}$ is larger than the distance $D_{2'}$. In still other embodiments, the distances $D_1$, $D_2$, $D_3$, and/or $D_4$ described above in conjunction with FIG. 1A can be larger than the distances $D_{1'}$, $D_{2'}$, $D_{3'}$, and/or $D_{4'}$, respectively.

In some embodiments, a sum of distances $D_{1'}$ and $D_{2'}$ can be substantially equal to the width $W_{1'}$. In other embodiments, a sum of distances $D_{1'}$ and $D_{2'}$ can be larger or smaller than the width $W_{1'}$. In still other embodiments, a sum of distances $D_{3'}$ and $D_{4'}$ can be substantially equal to the width $W_{2'}$. In yet still other embodiments, a sum of distances $D_{3'}$ and $D_{4'}$ can be larger or smaller than the width $W_{2'}$.

FIG. 2B is a cross-sectional view of an exemplary integrated circuit taken along a section line 2B-2B shown in FIG. 2A. In FIG. 2B, the metallic structures 270a-270d can directly contact the source region 211, the drain regions 213, 223, and the source region 221. The metallic structures 240, 250, and 260 can be electrically coupled with the source region 211, the drain regions 213, 223, and the source region 221 through the metallic structures 270a-270d. In some embodiments, the metallic structures 270a-270d can be disposed through the dielectric layer 251 and the ESL 253, directly contacting the silicide regions 211b, 213b, 221b, and 223b, respectively.

In some embodiments, the metallic structures 270a-270d can each include at least one barrier layer (not shown) at their bottom regions. The barrier layer may comprise at least one material such as aluminum oxide, aluminum, aluminum nitride, titanium, titanium nitride (TiN), tantalum, tantalum nitride, other suitable material, and/or combinations thereof. In some embodiments, the metallic structures 270a-270d each can be made of at least one material, such as aluminum, copper, Ti, TiN, TaN, Ta, TaC, TaSiN, W, WN, MoN, $MoON$, $RuO_2$, and/or other suitable materials. In other embodiments, the metallic structures 270a-270d can each be made of tungsten, and the metallic structures 240, 250, and 260 can each be made of copper.

In some embodiments, top surfaces of the metallic structures 270a-270d can be substantially level with top surfaces of conductive layers 235a and 235b. The term "substantially level with" here can mean that the top surfaces of the metallic structures 270a-270d can be higher than the top surfaces of the conductive layers 235a and 235b by a distance, e.g., the thickness of the ESL 253. In some embodiments, the term "substantially level with" here can mean that the top surfaces of the metallic structures 270a-270d can be lower than the top surface of the ESL 253 due to a dishing effect on the top surfaces of the metallic structures 270a-270d resulting from an etch-back process or a chemical-mechanical polish (CMP) process. In other embodiments, the term "substantially level with" here can mean that the top surfaces of the metallic structures 270a-270d can be lower than the top surfaces of the conductive layers 235a and 235b due to a dishing effect on the top surfaces of the metallic structures 270a-270d resulting from an etch-back process or a chemical-mechanical polish (CMP) process.

Referring to FIG. 2A-2B, it is found that the metallic structures 270a-270d can be deployed for electrical connections between the metallic structures 240, 250, and 260 and the respective source region 211, the drain regions 213, 223, and the source region 221. The metallic structures 270a-270d can substantially cover the respective diffusion areas 210 and 220 in the routing direction. The resistances from the metallic structures 270a-270d to the source and drain regions can be desirably reduced. In some embodiments, the overlap distances $D_{1'}$-$D_{4'}$, of the metallic structures 240, 250, and 260 that are deployed for electrical connections can be reduced. It is also found that the top surfaces of the metallic structures 270a-270d can be substantially level with the top surfaces of conductive layers 235a and 235b. Parasitic capacitances between the metallic structures 270a and 270b and between the metallic structures 270c and 270d are low.

Figure 3:
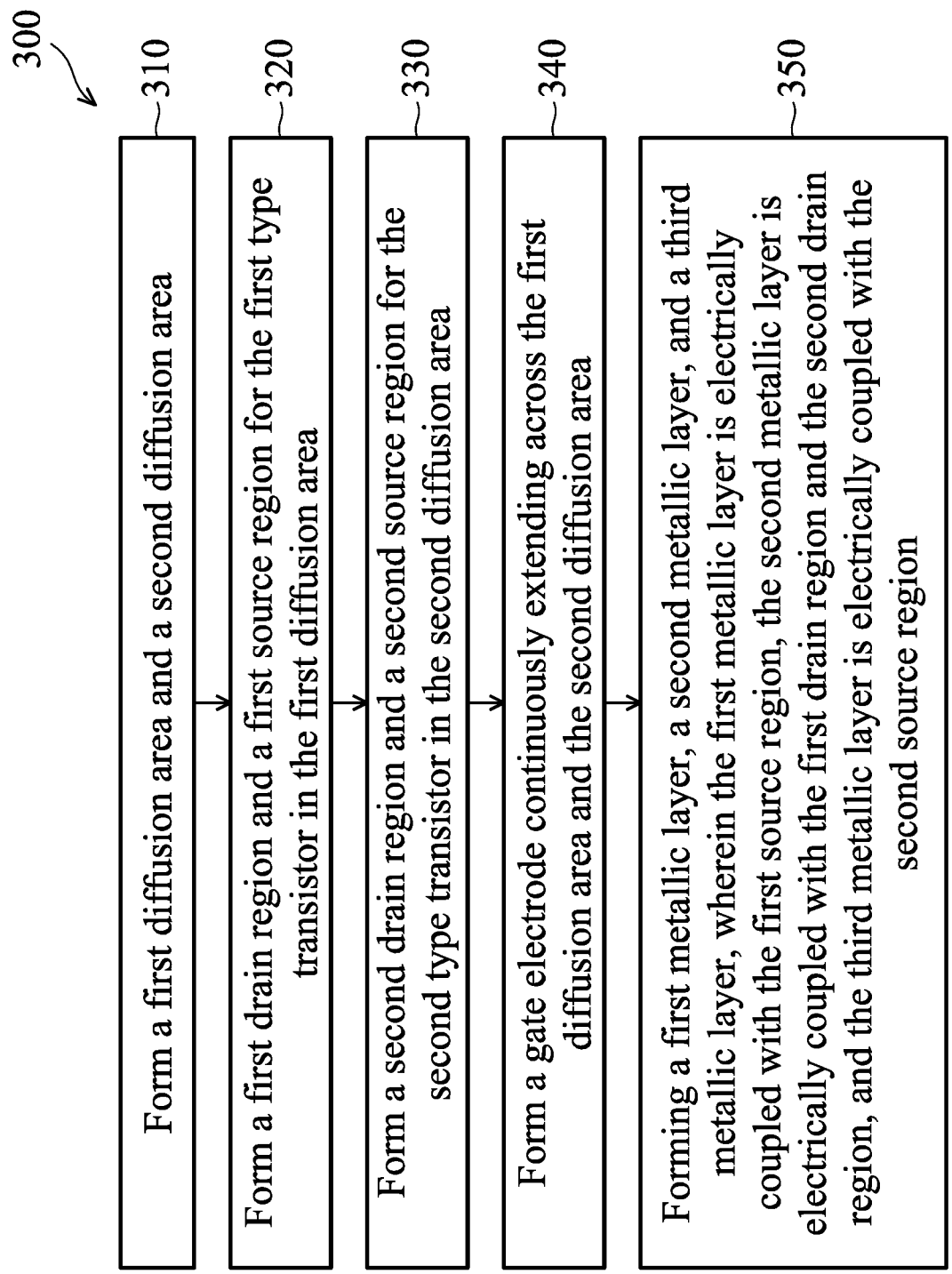
FIG. 3 is a flowchart illustrating an exemplary method of forming an integrated circuit.

FIG. 3 is a flowchart illustrating an exemplary method of forming an integrated circuit. FIGS. 4A-4E are schematic cross-sectional views illustrating another exemplary method of forming the integrated circuit 200 taken along a section line 2B-2B shown in FIG. 2A. In FIG. 3, a method 300 of forming an integrated circuit can include forming a first diffusion area and a section diffusion area on a substrate (process 310).

Figure 4A:
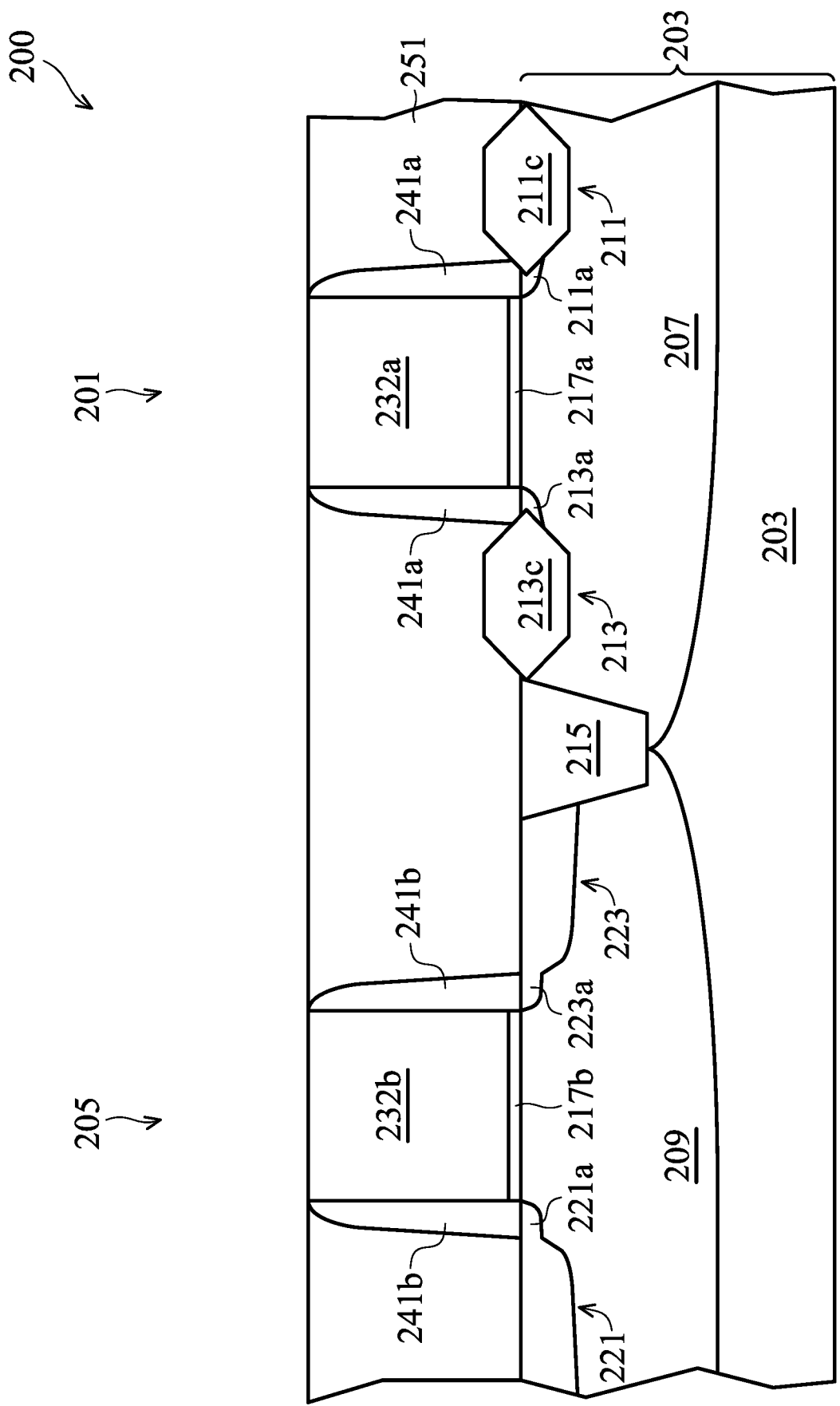
FIGS. 4A-4E are schematic cross-sectional views illustrating another exemplary method of forming an integrated circuit taken along a section line 2B-2B shown in FIG. 2A.
Figure 4B:
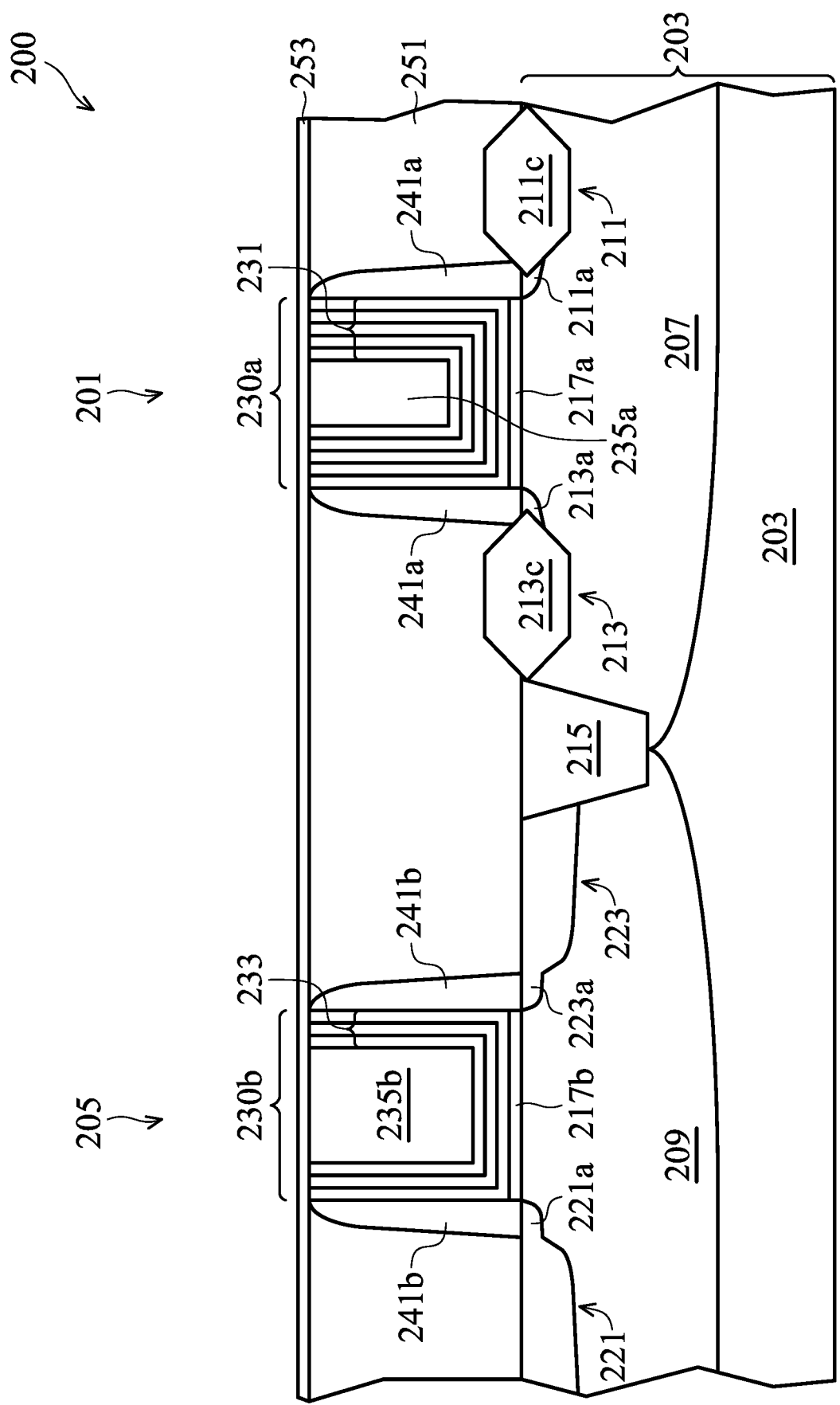

In some embodiments, the process 310 can form the diffusion areas 210 and 220 on the substrate 203 as shown in FIGS. 2A and 4A. In some embodiments, the process 310 can include forming the isolation structure 215 separating the diffusion area 210 from the diffusion area 220. In some embodiments, the formation of the isolation structure 215 may include patterning the semiconductor substrate 203 by a photolithographic process, etching a trench in the substrate (for example, by using a dry etching, wet etching, and/or plasma etching process), and filling the trench (for example, by using a chemical vapor deposition process) with a dielectric material. In some embodiments, the isolation structure 215 may have a multi-layer structure such as a thermal oxide liner layer filled with silicon nitride or silicon oxide. In some embodiments, the process 310 can be referred to as a STI process or a LOCOS process.

Referring to FIG. 4A, the N-type well region 207 and/or the P-type well region 209, in some embodiments, can be optionally formed in diffusion areas 201 and 205, respectively. The N-type well region 207 and/or the P-type well region 209 can be formed, for example, by photolithographic processes and ion implantation processes. In some embodiments, a thermal process and/or a rapid thermal process (RTP) can be performed to active dopants in the N-type well region 207 and/or the P-type well region 209.

Referring to FIG. 3, the method 300 can include forming a drain region and a source region for the first type transistor in the first diffusion area (process 320). In some embodiments forming the P-type transistor 201 as shown in FIG. 4A, the process 320 can form the source region 211 and the drain region 213. IN some embodiments, the source and drain regions 211 and 213 can each include a P-type heavily doped region that can be formed, for example, by a photolithographic process and an ion implantation process.

In other embodiments, the process 320 can include forming the structures 211c and 213c in the source region 211 and the drain region 213, respectively. The structures 211c and 213c can provide a stress to the channel of the P-type transistor 201. In some embodiments, the structures 211c and 213c can be formed by an epitaxial process, a reduced-pressure CVD (RPCVD) process, a molecular beam epitaxy (MBE) process, a chemical vapor deposition (CVD) process, a metal-organic chemical vapor deposition (MOCVD) process, an atomic layer deposition (ALD) process, a multi-layer epitaxial process, or any combinations thereof.

In some embodiments, the process 320 can optionally include forming the P-type LDDs 211a and 213a below spacers 241a. The P-type LDDs 211a and 213a can be formed, for example, by a tilt-angle ion implantation process. In some embodiments, silicide regions can be formed on the structures 211c and 213c before a process 340 forming gate electrode portions, wherein the process can be referred to as a silicide-first process. In other embodiments, the process 320 can include forming the silicide regions 211b and 211c described below in conjunction with FIG. 4C. In other some embodiments, a thermal process and/or a rapid thermal process (RTP) can be optionally performed to active dopants in the source region 211 and the drain region 213.

Referring again to FIG. 3, the method 300 can include forming a drain region and a source region for the second type transistor in the second diffusion area (process 330). In some embodiments forming the N-type transistor 205 as shown in FIG. 4A, the process 330 can form the source region 221 and the drain region 223. In some embodiments, the source and drain regions 221 and 223 can each include an N-type heavily doped region that can be formed, for example, by a photolithographic process and an ion implantation process.

In other embodiments, the process 330 can include forming a stress structure (not shown) in each of the source and drain regions 211 and 213. The stress structures can provide a stress to the channel of the N-type transistor 205 that is opposite to the stress provided by the structures 211c and 213c. The stress structures can be formed by an epitaxial process, a reduced-pressure CVD (RPCVD) process, a molecular beam epitaxy (MBE) process, a chemical vapor deposition (CVD) process, a metal-organic chemical vapor deposition (MOCVD) process, an atomic layer deposition (ALD) process, a multi-layer epitaxial process, or any combinations thereof.

In some embodiments, the process 330 can optionally include forming the N-type LDDs 221a and 223a below spacers 241b. The N-type LDDs 221a and 223a can be formed, for example, by a tilt-angle ion implantation process. In some embodiments, silicide regions can be formed on the source region 211 and the drain region 213 before the process 340 forming gate electrode portions, wherein the process can be referred to as a silicide-first process. In other embodiments, the process 330 can include forming the silicide regions 221b and 221c described below in conjunction with FIG. 4C. In other some embodiments, a thermal process and/or a rapid thermal process (RTP) can be optionally performed to active dopants in the source and drain regions 221 and 223. It is noted that the sequence of the processes 320 and 330 described above in conjunction with FIG. 3 can be switched. For example, the process 330 can be performed before the process 320. It is also noted that the process steps and/or their sequence in each of the processes 320 and 330 can be modified and/or switched. The scope of this application is not limited thereto.

Referring again to FIG. 3, the method 300 can include forming a gate electrode continuously extending across the first diffusion area and the second diffusion area (process 340). In some embodiments, the method can include forming a gate electrode 230 as shown in FIG. 2A.

The gate electrode 230 can be formed by a gate-first process or a gate-last process. In some embodiments using a gate-last process, the process 340 can include forming dummy gate electrodes 232a and 232b over the substrate 203 as shown in FIG. 4A. The dummy gate electrodes 232a and 232b can be made of at least one material such as polysilicon, amorphous silicon, silicon oxide, silicon nitride, a material having an etching rate that is substantially different from the dielectric layer 251 and/or the spacers 241a-241b. In some embodiments, the dummy gate electrodes 232a and 232b can be formed by a CVD process.

The process 340 can include removing the dummy gate electrodes 232a and 232b, for example, by a wet etch process, a dry etch process, or any combinations thereof. After removing the dummy gate electrodes 232a and 232b, the process 340 can include forming gate electrode portions 230a and 230b over the substrate 203. The gate electrode portions 230a and 230b can include multi-layer structures 231, 233 and conductive layers 235a, 235b, respectively. The multi-layer structures 231 and 233 can be formed, for example, by any suitable process, such as an ALD process, CVD process, a physical vapor deposition (PVD) process, a reduced-pressure CVD (RPCVD) process, a PECVD process, an MOCVD process, or any combinations thereof. The conductive layers 235a and 235b can be formed, for example, by any suitable process, such as an ALD process, CVD process, a physical vapor deposition (PVD) process, a reduced-pressure CVD (RPCVD) process, a PECVD process, an MOCVD process, a plating process, a sputtering process, or any combinations thereof. After the formation of the gate electrode portions 230a and 230b, an ESL layer 253 can be formed over the gate electrode portions 230a and 230b, for example, by a CVD process.

Referring again to FIG. 3, the method 300 can include forming a first metallic structure, a second metallic structure, and a third metallic structure (process 350). The first metallic structure can be electrically coupled with the first source region, the second metallic structure can be electrically coupled with the first drain region and the second drain region, and the third metallic structure can be electrically coupled with the second source region.

In some embodiments forming the metallic structures in a manner that is similar to the sectional view shown in FIG. 1B, the dielectric layer 155 can be formed over the ESL layer 153. The metallic structures 140, 150, and 160 can be formed through the dielectric layers 151, 155 and the ESL layer 153, such that the metallic structures 140, 150, and 160 can directly contact the respective source and drain regions 111, 113, 121, and 123.

Figure 4C:
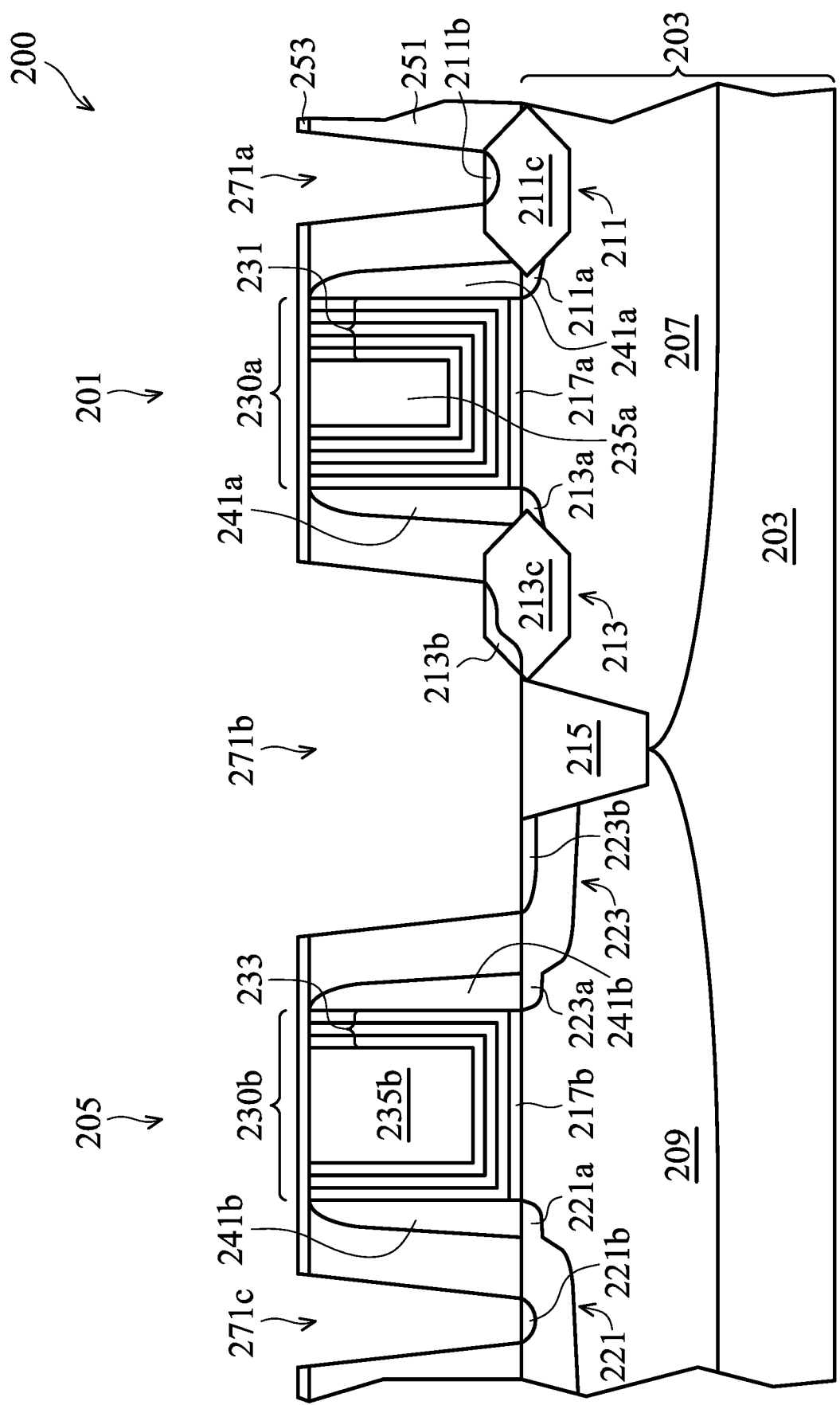

In some embodiments forming the metallic structures in a manner that is similar to the structures shown in FIGS. 2A-2B, the method 300 can further include forming metallic structures 270a-270d that are electrically coupled with the respective metallic structures 240, 250, and 260. In some embodiments, the method 300 can include forming openings 271a-271c through the dielectric layer 251 and the ESL 253. The openings 271a-271c can at least partially expose the respective source and drain regions 211, 213, 221, and 223 as shown in FIG. 4C.

In some embodiments, after forming the openings 271a-271c, silicide regions 211b, 213b, 221b, and 223b can be formed in the respective source and drain regions 211, 213, 221, and 223. As noted, the silicide regions 211b, 213b, 221b, and 223b shown in FIG. 4C are formed after the formation interfacial layers 217a-217b and the high-k dielectric layers of the multi-layer structures 231 and 233. The silicide regions 211b, 213b, 221b, and 223b are free from being subjected to thermal cycles of forming the interfacial layers 217a-217b and the high-k dielectric layers of the multi-layer structures 231 and 233. In some embodiments, the process of forming the silicide regions 211b, 213b, 221b, and 223b can be referred to as a silicide-last process.

Figure 4D:
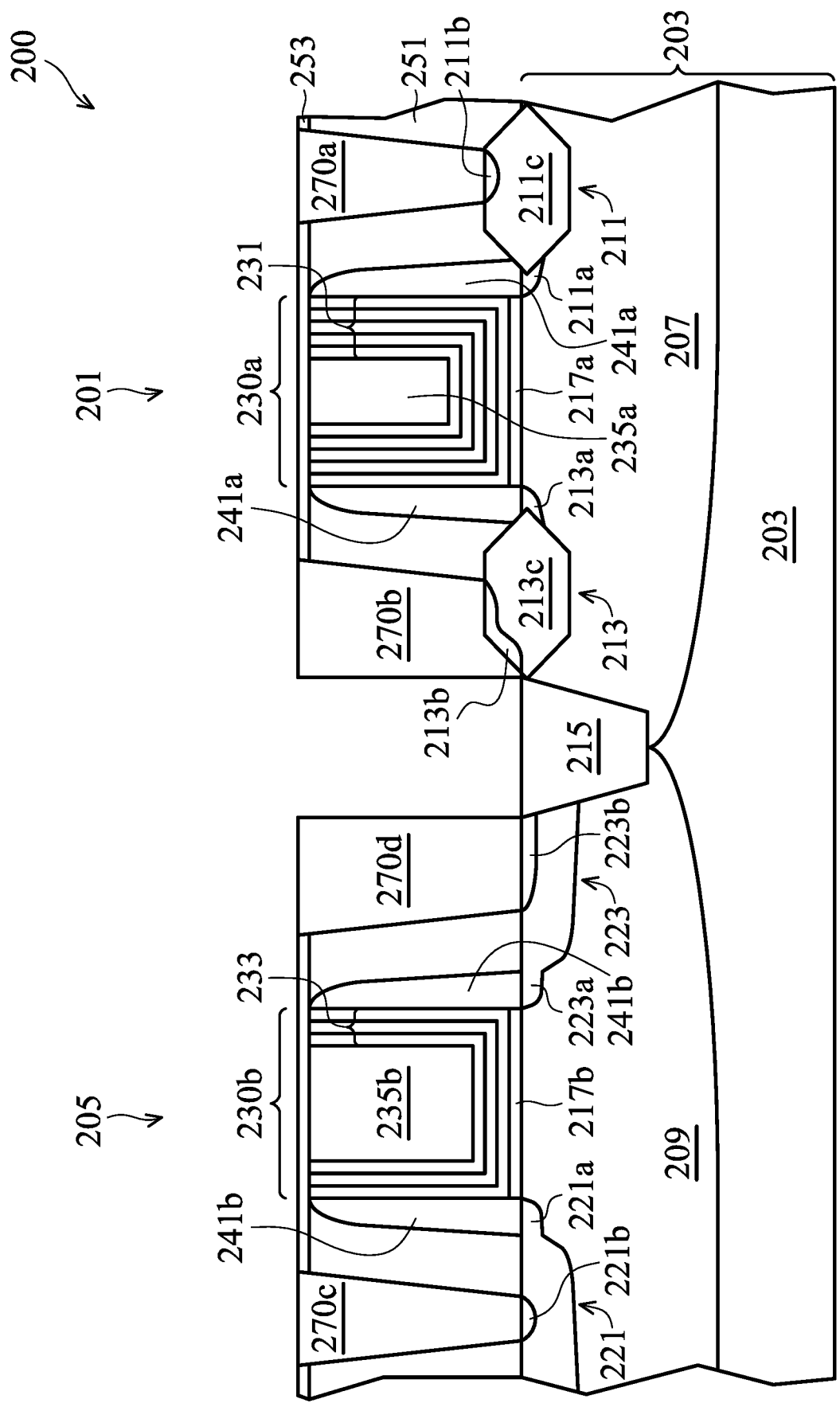

Referring to FIG. 4D, the method 300 can include forming metallic structures 270a-270d directly contacting the respective source and drain regions 211, 213, 221, and 223. The metallic structures 270a-270d can be formed, for example, by depositing a PVD process, a CVD process, an ALD process, a sputtering process, a plating process, other suitable methods, or any combinations thereof.

Figure 4E:
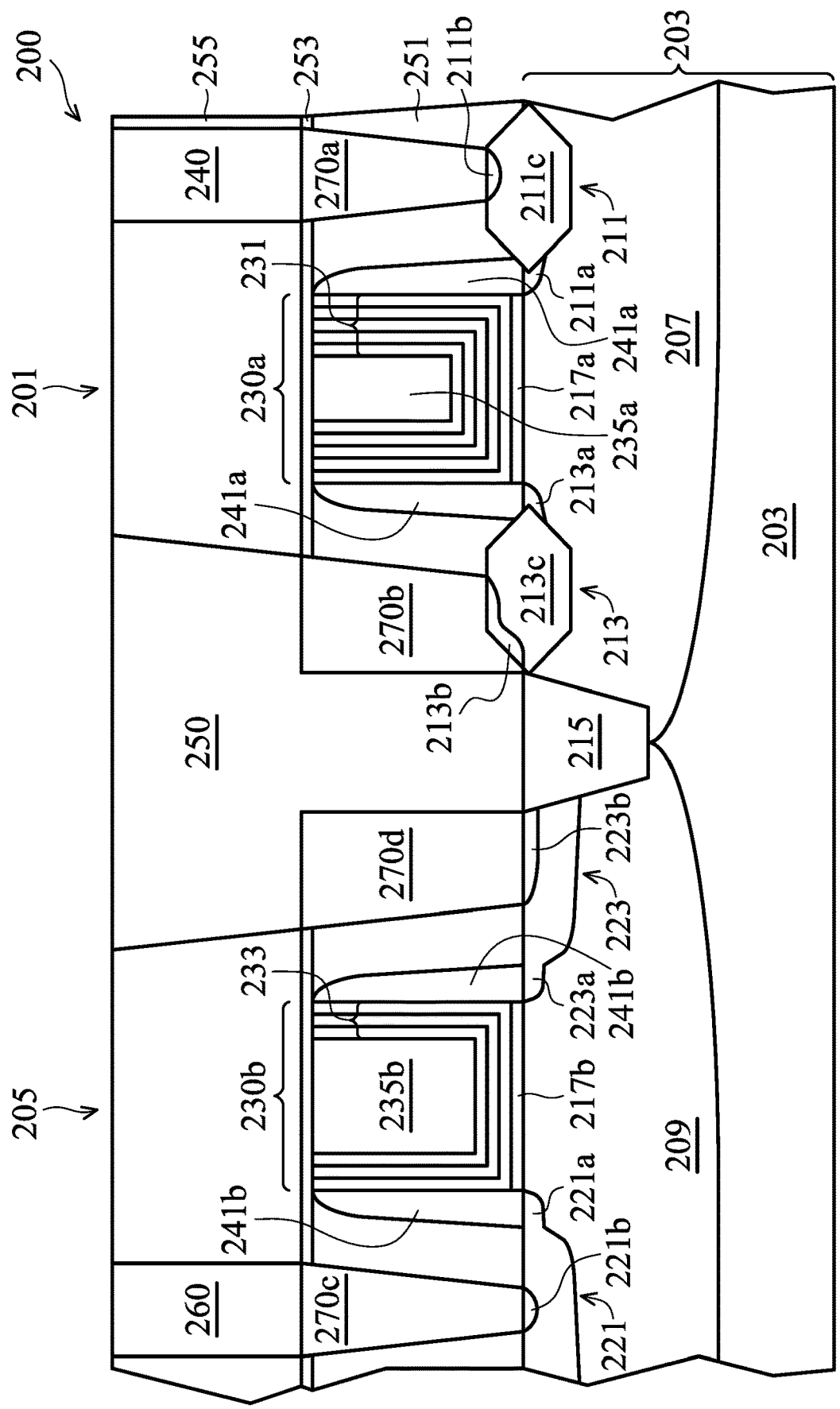

Referring to FIG. 4E, the process 350 (shown in FIG. 3) can include forming the metallic structures 240, 250, and 260 that are electrically coupled with the respective metallic structures 270a-270d. In some embodiments, the process 350 can include forming openings (not labeled) through the dielectric layer 255. The openings can at least partially expose the respective metallic structures 270a-270d. The metallic structures 240, 250, and 260 are then formed within the openings, electrically coupling with the respective metallic structures 270a-270d. In some embodiments, the metallic structures 240, 250, and 260 can be formed, for example, by depositing a PVD process, a CVD process, an ALD process, a sputtering process, a plating process, other suitable methods, and/or combinations thereof.

Figure 5:
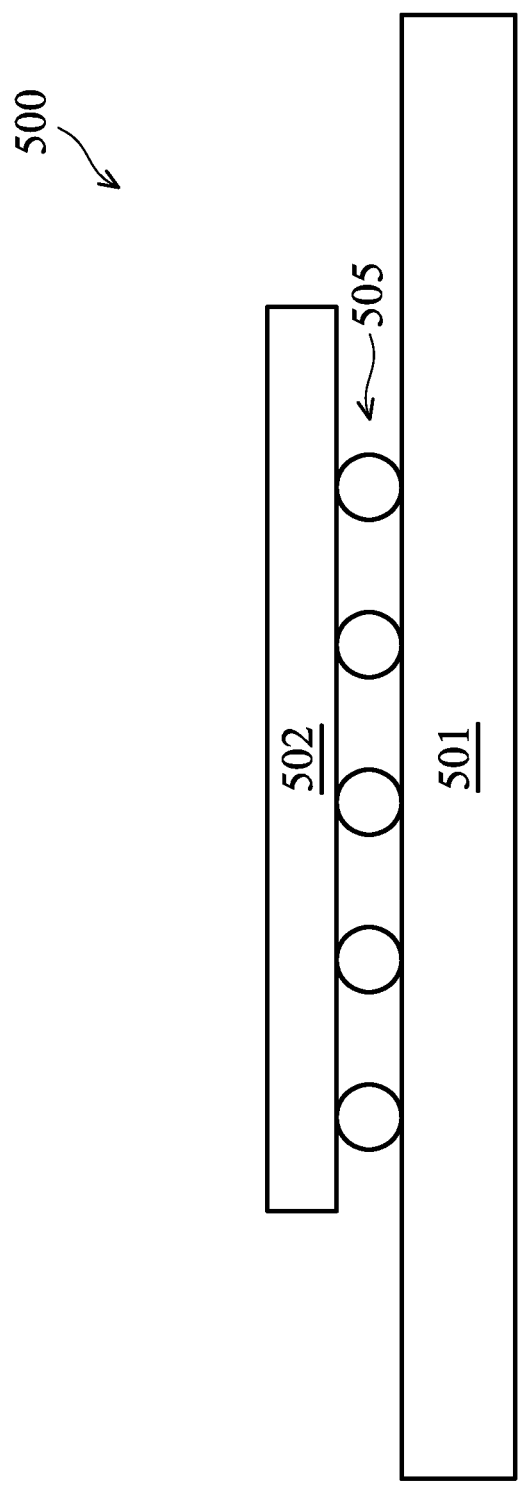
FIG. 5 is a schematic drawing illustrating a system including an exemplary integrated circuit disposed over a substrate board.

FIG. 5 is a schematic drawing illustrating a system including an exemplary integrated circuit disposed over a substrate board. In FIG. 5, a system 500 can include an integrated circuit 502 disposed over a substrate board 501. The substrate board 501 can include, in some embodiments, a printed circuit board (PCB), a printed wiring board and/or other carrier that is capable of carrying an integrated circuit. The integrated circuit 502 can be similar to the integrated circuit 100 or 200 described above in conjunction with FIGS. 1A-1B and 2A-2B, respectively. The integrated circuit 502 can be electrically coupled with the substrate board 501. In some embodiments, the integrated circuit 502 can be electrically coupled with the substrate board 501 through bumps 505. In other embodiments, the integrated circuit 502 can be electrically coupled with the substrate board 501 through wire bonding (not shown). The system 500, in some embodiments, can be part of an electronic system such as computers, wireless communication devices, computer-related peripherals, entertainment devices, or the like.

In some embodiments, the system 500 including the integrated circuit 502 can provide an entire system in one IC, so-called system-on-chip (SOC) or system-on-integrated-circuit (SOIC) devices. These SOC/SOIC devices may provide, for example, all of the circuitry needed to implement a cell phone, personal data assistant (PDA), digital VCR, digital camcorder, digital camera, MP3 player, or the like in a single integrated circuit.

Figure 6A:
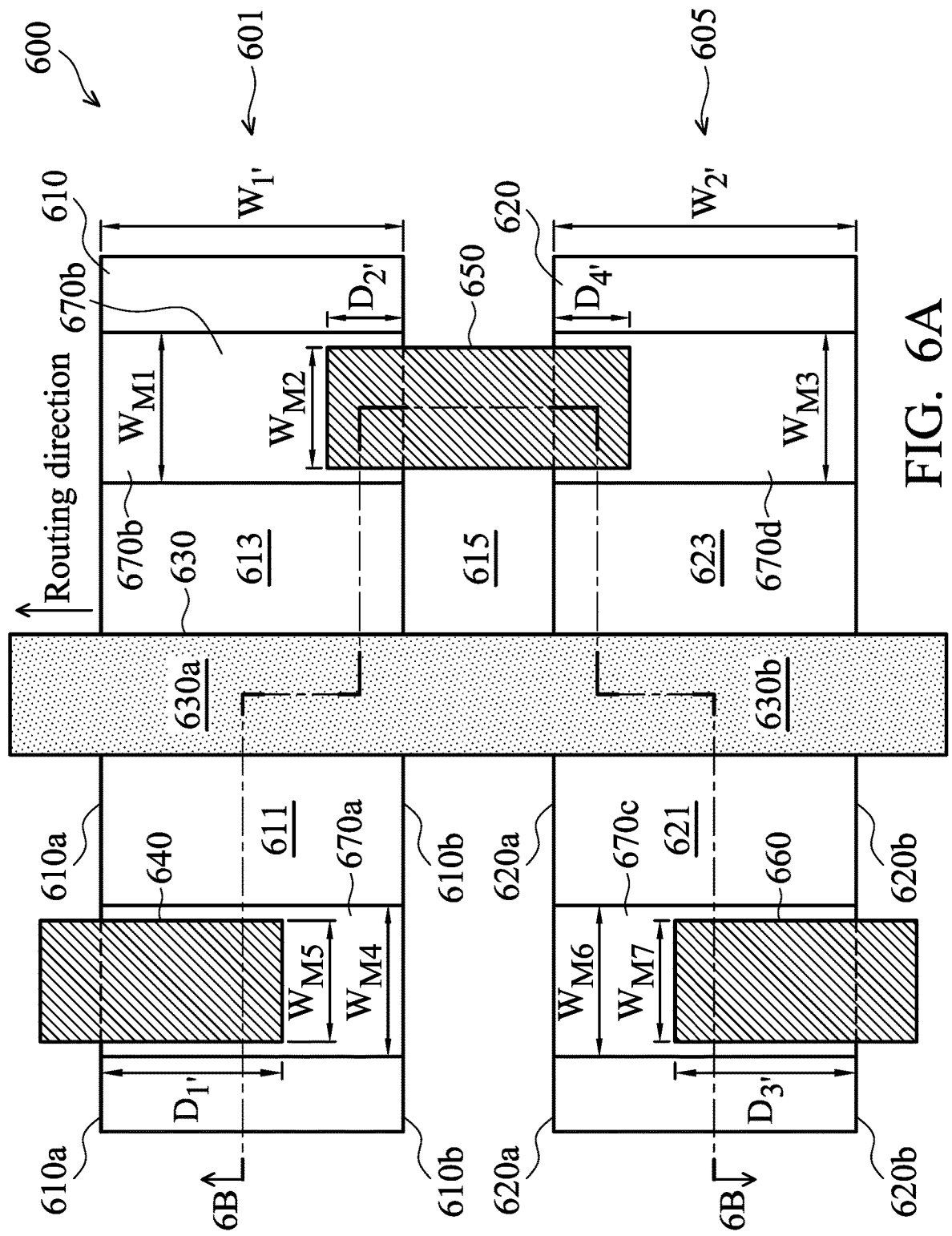
FIG. 6A is a schematic drawing illustrating exemplary layout layers of an exemplary integrated circuit as a top view.
Figure 6B:
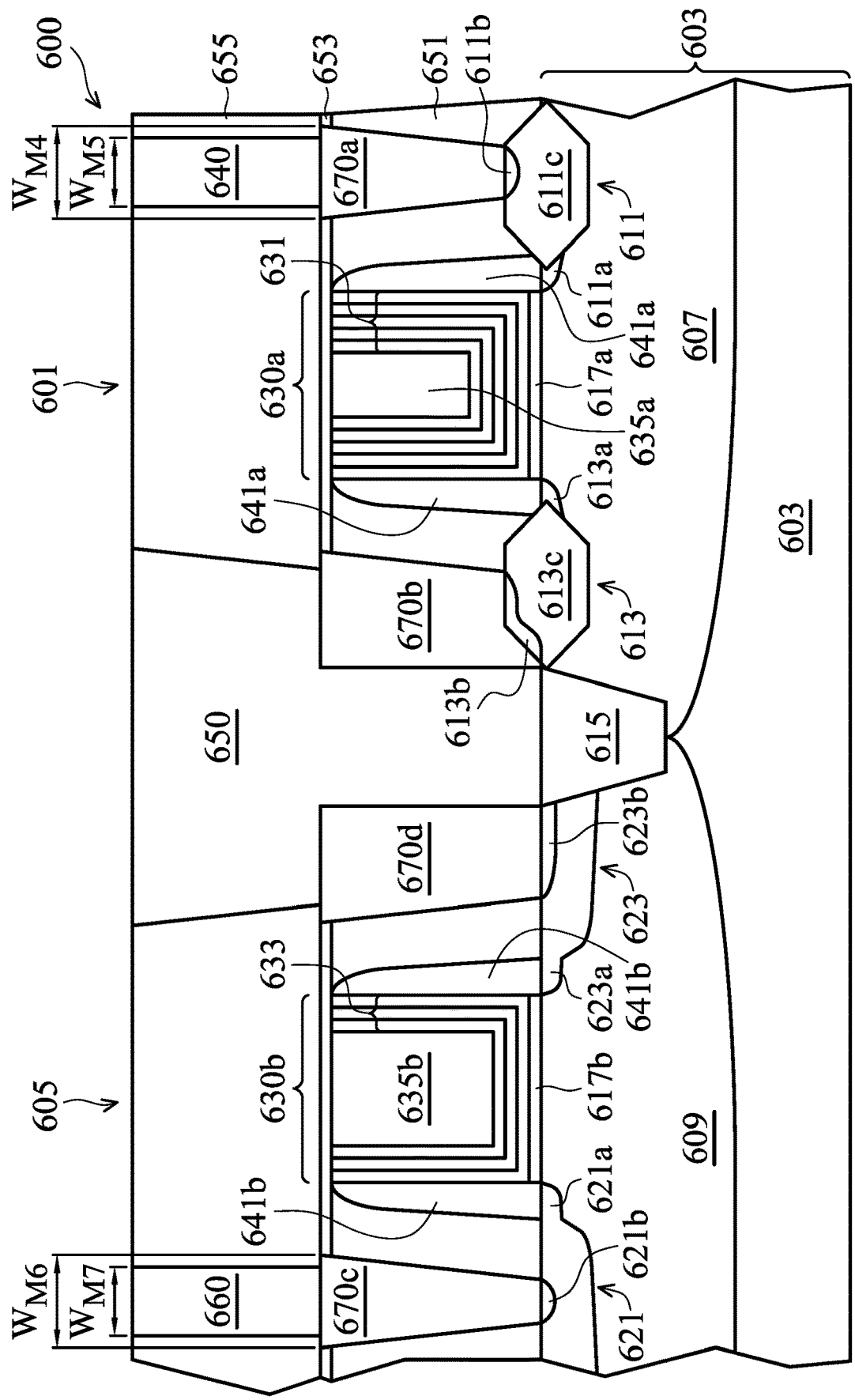
FIG. 6B is a cross-sectional view of an exemplary integrated circuit taken along a section line 6B-6B shown in FIG. 6A.

FIG. 6A is a schematic drawing illustrating exemplary layout layers of an exemplary integrated circuit; FIG. 6B is a corresponding cross-sectional view. Items of FIG. 6A/6B that are the same items in FIG. 2A are indicated by the same reference numerals, increased by 400. In FIG. 6A, an integrated circuit 600 includes diffusions areas 610 and 620 that are separated from each other and configured for different types of transistors 601 and 605, respectively. For example, the diffusion area 610 is configured for a P-type transistor and the diffusion area 620 is configured for an N-type transistor. The transistor 601 includes a source region 611 and a drain region 613 in the diffusion area 610. The transistor 605 includes a source region 621 and a drain region 623 in the diffusion area 620.

Referring to FIG. 6A, the integrated circuit 600 including a gate electrode 630 continuously extends across the diffusion areas 610 and 620 in a routing direction. In some embodiments, the integrated circuit 600 includes a plurality of metallic structure, e.g., metallic structures 670a-670d, each directly contacting one of the source regions 611, 621 and the drain regions 613, 623. The integrated circuit 600 can include metallic structures 640, 650 and 660 that are disposed over and electrically coupled with the metallic structures 670a, 670b, 670d and 670c, respectively. In some embodiment, the metallic structure 650 continuously extends from the metallic structure 670b to the metallic structure 670d.

In some embodiments, a width $W_{M1}$ of the metallic structure 670b is substantially equal to or larger than a width $W_{M2}$ of the metallic structure 650. In other embodiments, a ratio of the width $W_{M1}$ to width $W_{M2}$ can range from about 1:1 to about 2:1. In still other embodiments, a ratio of the width $W_{M1}$ to width $W_{M2}$ can range from about 1.3:1 to about 1.6:1

In some embodiments, a width $W_{M3}$ of the metallic structure 670d is substantially equal to or larger than a width $W_{M2}$ of the metallic structure 650. In other embodiments, a ratio of the width $W_{M3}$ to width $W_{M2}$ can range from about 1:1 to about 2:1. In still other embodiments, a ratio of the width $W_{M3}$ to width $W_{M2}$ can range from about 1.3:1 to about 1.6:1.

In some embodiments, a width $W_{M4}$ of the metallic structure 670a is substantially equal to or larger than a width $W_{M5}$ of the metallic structure 650. In other embodiments, a ratio of the width $W_{M4}$ to width $W_{M5}$ can range from about 1:1 to about 2:1. In still other embodiments, a ratio of the width $W_{M4}$ to width $W_{M5}$ can range from about 1.3:1 to about 1.6:1.

In some embodiments, a width $W_{M6}$ of the metallic structure 670c is substantially equal to or larger than a width $W_{M7}$ of the metallic structure 660. In other embodiments, a ratio of the width $W_{M6}$ to width $W_{M7}$ can range from about 1:1 to about 2:1. In still other embodiments, a ratio of the width $W_{M6}$ to width $W_{M7}$ can range from about 1.3:1 to about 1.6:1.

It is noted that at least one of the widths $W_{M1}$, $W_{M3}$, $W_{M4}$ and $W_{M6}$ is substantially equal to or larger than the widths $W_{M2}$, $W_{M5}$ and $W_{M7}$, respectively. In some embodiments, only one of the metallic structures 670a-670d is wider and applied in the integrated circuit 600. In other embodiments, two or more of the metallic structures 670a-670d are wider and applied in the integrated circuit 600. In still other embodiments, all the metallic structures 670a-670d are wider than the respective metallic structures 640, 650 and 660.

As noted, adjusting the widths and/or lengths of the metallic structures 640, 650, 660 and/or 670a-670d can modify the contact resistances and/or parasitic capacitances of the integrated circuit 600. Changes of the contact resistances and/or parasitic capacitances may affect the operating speed of the integrated circuit 600. For example, the width of each of the metallic structures 640, 650 and 660 is fixed at a value about 20 nanometer (nm) for each of samples I-V. The widths of each of the metallic structures 670a-670d of the samples I-V are about 26 nm, 30 nm, 32 nm, 34 nm and 38 nm, respectively. Accordingly, the width ratio of the metallic structures 670a-670d and the respective metallic structures 640, 650 and 660 are 1.3:1, 1.5:1, 1.6:1, 1.7:1 and 1.9:1 for the samples I-V, respectively. It is noted that the sizes of the metallic structures 670a-670d described above are merely exemplary. In some embodiments, the sizes of the metallic structures 670a-670d can be scaled up or down depending on the applied technology node. The scope of this application is not limited thereto.

Table 2 illustrates simulation results including parasitic capacitances, contact resistances and operating speeds of the integrated circuits in response to the changes of the width ratios as described above.

TABLE 2

|  | Sample I | Sample II | Sample III | Sample IV | Sample V |
| --- | --- | --- | --- | --- | --- |
| Width ratio | 1.3:1 | 1.5:1 | 1.6:1 | 1.7:1 | 1.9:1 |
| Parasitic capacitance | 1 | 1 | 1 | 1 | 1 |
| Contact resistance | 1 | 0.98 | 0.97 | 0.96 | 0.95 |
| Operating speed | 1 | 1.014 | 1.02 | 1.028 | 1.037 |

Applicants found that the changes of the width ratio among the metallic structures 640, 650, 660 and/or 670a-670d can achieve unexpectedly improvement for operating speed of integrated circuits. As shown in Table 2, the integrated circuit of the sample I having the 1.3:1 width ratio is used as a base. It is found that the samples I-V have the same parasitic capacitance due the same width of the metallic structures 640, 650 and 660. It is also found that the contact resistance gradually declines due to the increase of the width of the metallic structures 670a-670d in the samples I-V. With the decrease of the contact resistance, the operating speed of the integrated circuit is increased in response to the increase of the width of the metallic structures 670a-670d.

It is noted that the integrated circuit 600 can be formed by a method that is as same as or substantially similar to the method 300 described above in conjunction with FIG. 3 and/or process stages described above in conjunction with FIGS. 4A-4E. The detailed description of the method is not repeated. It is also noted that the integrated circuit 600 can be applied in the system 500 described above in conjunction with FIG. 5.

In an embodiment of this application, an integrated circuit includes a first diffusion area for a first type transistor. The first type transistor includes a first drain region and a first source region. A second diffusion area for a second type transistor is separated from the first diffusion area. The second type transistor includes a second drain region and a second source region. A gate electrode continuously extends across the first diffusion area and the second diffusion area in a routing direction. A first metallic structure is electrically coupled with the first source region. A second metallic structure is electrically coupled with the second drain region. A third metallic structure is disposed over and electrically coupled with the first and second metallic structures. A width of the first metallic structure is substantially equal to or larger than a width of the third metallic structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first diffusion area for a first type transistor, the first type transistor including a first drain region and a first source region in the first diffusion area on a substrate having a top surface;
a second diffusion area for a second type transistor, the second type transistor including a second drain region and a second source region in the second diffusion area;
an isolation structure interposing the first and second diffusion areas;
a gate electrode continuously extending across the first diffusion area and the second diffusion area in a routing direction;
a first metallic structure made of tungsten and extending in the routing direction, the first metallic structure overlaps the first diffusion area and is electrically coupled with the first drain region, wherein the first metallic structure has a first top surface being comprised of tungsten spaced a first distance above the top surface of the substrate and a first sidewall and a second sidewall each extending from the top surface of the substrate to the top surface of the first metallic structure;
a second metallic structure made of tungsten and extending in the routing direction and coplanar with the first metallic structure, the second metallic structure overlapping the second diffusion area in the routing direction and is electrically coupled with the second drain region, wherein the second metallic structure has a second top surface being comprised of tungsten spaced the first distance above the top surface of the substrate and has a third sidewall and a fourth sidewall each extending from the top surface of the substrate to the top surface of the second metallic structure, wherein the third sidewall is spaced a separation distance from the second sidewall;
an etch stop layer on a top surface of the gate electrode and extending from the gate electrode to interface with the first metallic structure, wherein the first top surface and the second top surface are substantially level with the etch stop layer; and
a third metallic structure made of copper, the third metallic structure having a first portion over the first metallic structure, a second portion over the second metallic structure, and a third portion extending between the first and second portions, wherein the first portion of the third metallic structure has a third top surface of copper spaced a second distance above the top surface of the substrate, wherein the second distance is greater than the first distance and the second portion of the third metallic structure has a fourth top surface spaced the second distance above the top surface of the substrate, and wherein the third metallic structure interfaces each of the second sidewall and the third sidewall and the third portion is disposed in the separation distance from the third sidewall to the second sidewall; and a width of the first metallic structure in a direction perpendicular the routing direction and defined by the first sidewall is substantially equal to or larger than a width of the third metallic structure in the direction perpendicular the routing direction.

2. The integrated circuit of claim 1, wherein the third portion of the third metallic structure has a bottom surface including copper that physically interfaces a top surface of the isolation structure, and wherein the third portion of the third metallic structure has a fifth top surface including copper, the fifth top surface is spaced the second distance above the top surface of the isolation structure.

3. The integrated circuit of claim 1, further comprising:
a fourth metallic structure electrically coupled with the first source region; and
a fifth metallic structure over and electrically coupled with the fourth metallic structure,
wherein the fifth metallic structure and the first diffusion area overlap by a first distance in the routing direction, the third metallic structure and the first diffusion area overlap by a second distance in the routing direction, and the first distance is larger than the second distance.

4. The integrated circuit of claim 3, wherein a width of the fourth metallic structure in the direction perpendicular the routing direction is larger than a width of the fifth metallic structure in the direction perpendicular the routing direction.

5. The integrated circuit of claim 3, further comprising:
a sixth metallic structure electrically coupled with the second source region; and
a seventh metallic structure over and electrically coupled with the sixth metallic structure,
wherein the seventh metallic structure and the second diffusion area overlap by a third distance in the routing direction, the third metallic structure and the second diffusion area overlap by a fourth distance in the routing direction, and the third distance is larger than the fourth distance.

6. The integrated circuit of claim 5, wherein a width of the sixth metallic structure in the direction perpendicular the routing direction is larger than a width of the seventh metallic structure in the direction perpendicular the routing direction.

7. The integrated circuit of claim 1, wherein a ratio of the width of the first metallic structure to the width of the third metallic structure is at least 1.3:1.

8. The integrated circuit of claim 1, wherein the first and second metallic structures substantially continuously extend, in the routing direction, from an edge to an opposite edge of the first and second diffusion areas, respectively.

9. The integrated circuit of claim 1, wherein the third top surface and the fourth top surface of the third metallic structure are coplanar.

10. The integrated circuit of claim 1, wherein a bottom surface of the third portion of the third metallic structure and a bottom surface of the first metallic structure are coplanar.

11. An integrated circuit comprising:
a first diffusion area for a first type transistor, the first type transistor including a first drain region and a first source region in the first diffusion area;
a second diffusion area for a second type transistor, the second diffusion area being separated from the first diffusion area, the second type transistor including a second drain region and a second source region in the second diffusion area, the first diffusion area and the second diffusion area formed in a substrate;
a gate structure including a gate electrode continuously extending across the first diffusion area between the first drain region and the first source region and across the second diffusion area between the second drain region and the second source region, the extending of the gate structure being in a routing direction, wherein the gate structure further includes an interfacial layer disposed below the gate electrode, the interfacial layer physically interfacing a top surface of the substrate;
a first metallic structure of tungsten disposed on and physically interfacing a silicide region of the first drain region, wherein the first metallic structure overlaps a first distance of the first diffusion area in the routing direction, wherein the first metallic structure includes a first top surface, wherein the first drain region including the silicide region of the first drain region extends above the top surface the substrate;
a second metallic structure of tungsten disposed on and physically interfacing a silicide region of the second drain region, wherein the second metallic structure overlaps a second distance of the second diffusion area in the routing direction, wherein the second metallic structure includes a second top surface coplanar with the first top surface, and wherein the second metallic structure physically interfaces the silicide region of the second drain region substantially at a plane substantially coplanar with the top surface of the substrate; and
a third metallic structure of copper over and electrically coupled with the first metallic structure, wherein the third metallic structure overlaps a third distance of the first diffusion area in the routing direction, wherein the third distance is less than the first distance, and wherein the third metallic structure has a third top surface;
a fourth metallic structure of copper over and electrically coupled with the second metallic structure, wherein the fourth metallic structure overlaps a fourth distance of the second diffusion area in the routing direction, wherein the fourth distance is less than the third distance, and wherein the fourth metallic structure has a fourth top surface coplanar with the third top surface, and wherein the first top surface is closer a top surface of the substrate than the third top surface;
and wherein the first metallic structure has a first width, the second metallic structure has a second width and wherein the first width is greater than the second width, the first and second widths defined in a direction planar and perpendicular to the routing direction.

12. The integrated circuit of claim 11, wherein the third metallic structure has a third width, the fourth metallic structure has a fourth width and wherein the third width is greater than the fourth width, the third and fourth widths defined in a direction planar and perpendicular to the routing direction.

13. The integrated circuit of claim 11, further comprising:
a fifth metallic structure electrically coupled with the first drain region; and
a sixth metallic structure over and electrically coupled with the fifth metallic structure, wherein the fifth metallic structure overlaps the first diffusion area overlap by a third distance in the routing direction, wherein the third distance is less than the first distance.

14. The integrated circuit of claim 11, further comprising: an etch stop layer extending from on a top surface of the gate structure to on the first top surface of the first metallic structure.

* * * * *